Oct. 27, 1970 J. C. SONDERMEYER 3,536,958

AMPLIFIER PROTECTION CIRCUIT

Filed Dec. 5, 1967 2 Sheets-Sheet 1

Inventor:
JACK C. SONDERMEYER
BY Eugene M. Whitacre
Attorney

Oct. 27, 1970 J. C. SONDERMEYER 3,536,958

AMPLIFIER PROTECTION CIRCUIT

Filed Dec. 5, 1967 2 Sheets-Sheet 2

Inventor:
JACK C. SONDERMEYER
BY Eugene M. Whitacre
Attorney 3,536,958

AMPLIFIER PROTECTION CIRCUIT

Jack C. Sondermeyer, Somerville, N.J., assignor to RCA Corporation, a corporation of Delaware Filed Dec. 5, 1967, Ser. No. 688,215
Int. Cl. H02h 7/00
U.S. Cl. 317—33 1 Claim

ABSTRACT OF THE DISCLOSURE

Amplifier output transistor protection is provided by limiting input drive signals as a combined function of current through the transistor and voltage across the load so that transistor operation outside safe area ratings is precluded.

This invention relates to electrical signal amplifiers and in particular to high power transistor amplifiers.

Amplifiers having negative voltage feedback provide low output impedance, low distortion, and wide band frequency response characteristics. Under certain adverse conditions such amplifiers will supply large peak currents to a load or incidental short circuit with consequent increased power dissipation which may destroy the output transistor or transistors.

It is known in the art to design amplifier control circuits to protect power amplifiers against over-dissipation by attenuating the drive signal when dissipation becomes excessive. In such designs the control circuit has a time delay in response to overload conditions which may be too slow to protect the output transistor. It is also known to apply bias control so as to reduce the average amplifier current and thereby prevent excess dissipation in response to overload conditions. Circuits of this type have not proved to be satisfactory because the change in bias may cause operation on a non-linear transfer characteristic resulting in consequent distortion.

Amplifier design on the basis of only the dissipation ratings of the power transistor have proved to be inadequate and excessively costly. Furthermore, class B and A–B operation of the output transistors permits designs with low average power dissipation and relatively high power output. During high power output instantaneous dissipation exceeds steady state dissipation ratings for short periods of time, and because of a finite thermal mass, the depth and duration of these excursions need to be carefully controlled.

The limits of such non-destructive high dissipation excursions have been characterized in the art as the safe area limits of operation of the transistor. Therefore, an amplifier must not exceed these limits as specified by the transistor designer under the penalty of premature falure.

It is an object of this invention to provide a simple and effective circuit for overload protection of a transistor amplifier.

Still another object of this invention is to provide overload protection for a transistor power amplifier circuit with a response time shorter than the thermal time constant of the transistors used in the amplifier.

Still another object of this invention is to provide a circuit that limits the current in the transistor to safe values regardless of load or signal input characteristics.

Still another object of this invention is to provide amplifier current and dissipation limit protection which is a function of both transistor current and load voltage.

These objects are achieved by this invention in a transistor amplifier circuit where a voltage proportional to transistor current and a voltage proportional to load voltage are combined to effect limiting of signal drive to the output transistor precluding operation of the transistor beyond safe voltage and current limits.

A transistor amplifier embodying the invention includes means for both deriving a voltage indicative of transistor current and a voltage proportional to the load voltage. These voltages are combined so that when a threshold value is exceeded, drive signals are limited so that the transistor collector voltage and current are limited to safe values within safe area ratings.

In a specific embodiment of the invention, the overload protection circuit is applied to a complementary or quasicomplementary push-pull transistor amplifier. In such a circuit a pair of protection transistors are connected between the amplifier output terminal and a point on the biasing and signal drive network common to the base electrodes of the complementary output transistors. The voltage across the current sensing resistor together with the voltage across the load are combined to effect protection transistor conduction for output transistor current and voltage values outside safe area limits thereby limiting signal drive to the output transistors.

Other objects and features of this invention will become apparent when referring to the following specification in connection with the accompanying drawing in which.

Figure 1:
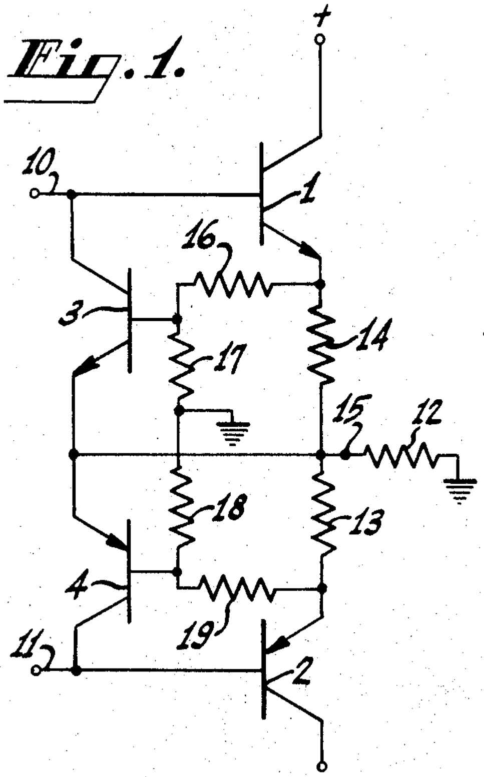
FIG. 1 is a schematic circuit diagram of an amplifier output transistor circuit embodying the invention.

Referring now to FIG. 1, an amplifier circuit of the complementary symmetry push-pull type is shown including a protection circuit embodying the invention. A pair of power output transistors 1 and 2 of opposite conductivity types are driven by an input and biasing circuit, not shown, which is coupled to terminals 10 and 11. The transistors 1 and 2 are coupled to an output terminal 15, through current sampling resistors 14 and 13. A loudspeaker or other appropriate load may be connected between the output terminal 15 and ground. Resistor 12 is representative of such a load. Additional circuitry including transistors 3 and 4 limit the current in the output transistors. The transistors 3 and 4 serve to protect the output transistors 1 and 2 by connecting the input signal and bias circuit to the output load terminal 15 whenever collector currents and voltages of transistors 1 and 2 are in excess of safe values. Protection of the output transistor results because base signal drive to transistors 1 and 2 is shunted by transistors 3 and 4.

The limiting of transistor voltage and current is achieved for a range of values which approximates the safe area of transistor operation for all possible output loads. The area limits of operation are such that when load voltage is small and transistor collector voltage drop is large, the current is limited to a small value. Correspondingly, the area limits are such that if the load develops significant voltage and trnsistor voltage is less, greater currents are permitted to flow. Therefore, safe limiting for the limits described above is proportional to current and inversely proportional to load voltage.

Referring again to FIG. 1, resistors 14, 16, 17 and load resistor 12 form a resistor bridge driven by output transistor 1. Resistor 12 and resistor 17 are connected to ground and their remaining leads are connected to resistors 14 and 16 respectively. The common connection of resistors 14 and 16 is the input to the bridge, and is connected to the emitter of transistor 1. The emitter of protection transistor 3 is connected to the junction of resistors 12 and 14 and its base is connected to the junction of resistors 16 and 17 so that transistor 3 is a detector of unbalance in the bridge formed by resistors 12, 14, 16 and 17. If the current in resistor 14 is equal to the current in the load resistor 12 and the impedance ratio of resistor 14 to resistor 12 equals the ratio of resistor 16 to 17, then a balance occurs and no voltage is developed between the base and emitter electrodes of the transistor 3. When, however, the mismatch of the impedance ratios is sufficient to exceed the transistor threshold of conduction, then signal drive limiting occurs and safe area operation is provided.

Figure 2:
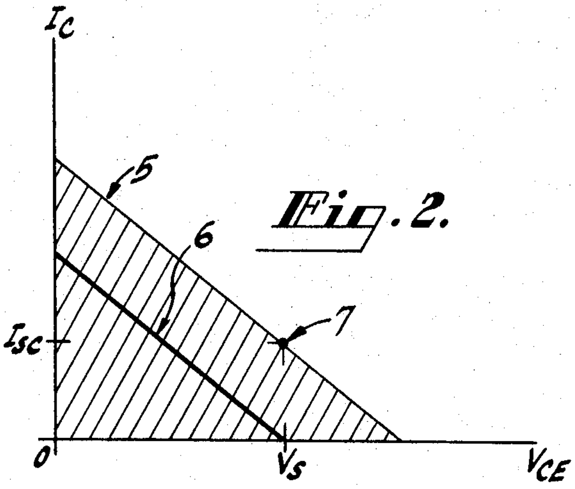
FIG. 2 is a graph of the collector current and voltage values of the safe area limiting provided by the circuit of FIG. 1.

FIG. 2 shows a graph of the safe area limiting of transistor operation provided by the circuit in FIG. 1. The graph displays how the circuit permits high currents when the voltage drop across the transistor is low and correspondingly low currents when the transistor voltage drop is high acocrding to a safe area limit line 5. The entire area under line 5 and indicated with shading lines is the safe area of transistor operation permitted by the protection circuit. A typical load line 6 is shown within the limits of protection provided by the circuit. In fact, and load may be connected to the output of the amplifier and be driven to the current limits shown by the limit line 5.

An important aspect of this invention is that the detector transistor 3 will only respond to bridge unbalance of on polarity. The polarity is determined by the choice of transistor 3 or 4 conductivity type, to detect unbalance of the bridge for load impedances less than the balancing value. An additional important feature of this invention is that a threshold is provided in the detector transistor input to prevent limiting of the input signal drive for an acceptable range of load values. This range of load values and the magnitude of the limit currents and voltages is determined by the resistance of resistors 14, 16, and 17 with respect to the transistor base emitter conduction threshold. It is readily apparent that the conduction threshold in the bridge detector circuit may be raised by the inclusion of a diode in series with the transistor emitter. It is this threshold which permits normal amplifier operation for a range of load impedance within the safe area limits set by design. Furthermore, reactive loads may be substituted for load resistor 12 and the threshold will permit transistor currents and voltages for driving a reactive load within the same safe area limits. The slope of the safe area limit line 5 is determined by the magnitude of the current sampling resistor 14 multiplied by the ratio of bridge resistor 17 to bridge resistor 16. The short circuit limit current located on the safe area limit line at 7 will be set by the threshold voltage $V_{be}$ required between base and emitter of transistor 3 for limiting modified by the resistor ratio as shown.

$$I_{sc}=V_{be}\frac{R_{17}+R_{16}}{R_{17}R_{14}}$$

Protection transistor 3 and the bridge network including resistors 14, 16 and 17 and load resistor 12 combine to provide current and voltage limiting of only output transistor 1. A second protection circuit including transistor 4 and a bridge network comprising resistors 13, 18, 19 and load resistor 12 combine to protect output transistor 2. The pair of protection networks operate on alternate polarities of signal drive to protect and limit the operation of the complementary output transistors which conduct on alternate polarities to drive the common load. In this way two independent protection circuits provide safe area limiting for two power output transistors and complete protection for a push-pull complementary symmetry output stage.

Figure 3:
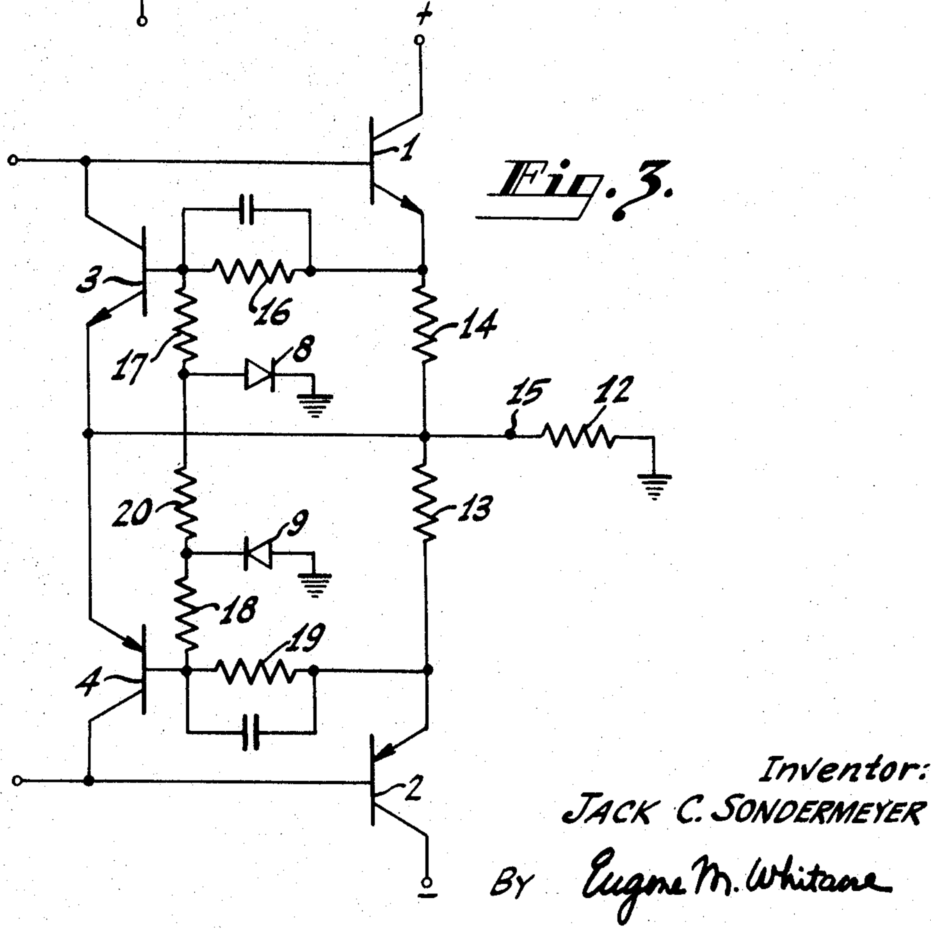
FIG. 3 is a schematic circuit diagram of a transistor amplifier circuit employing safe area contour control by means of a diode.
Figures 4, 5:
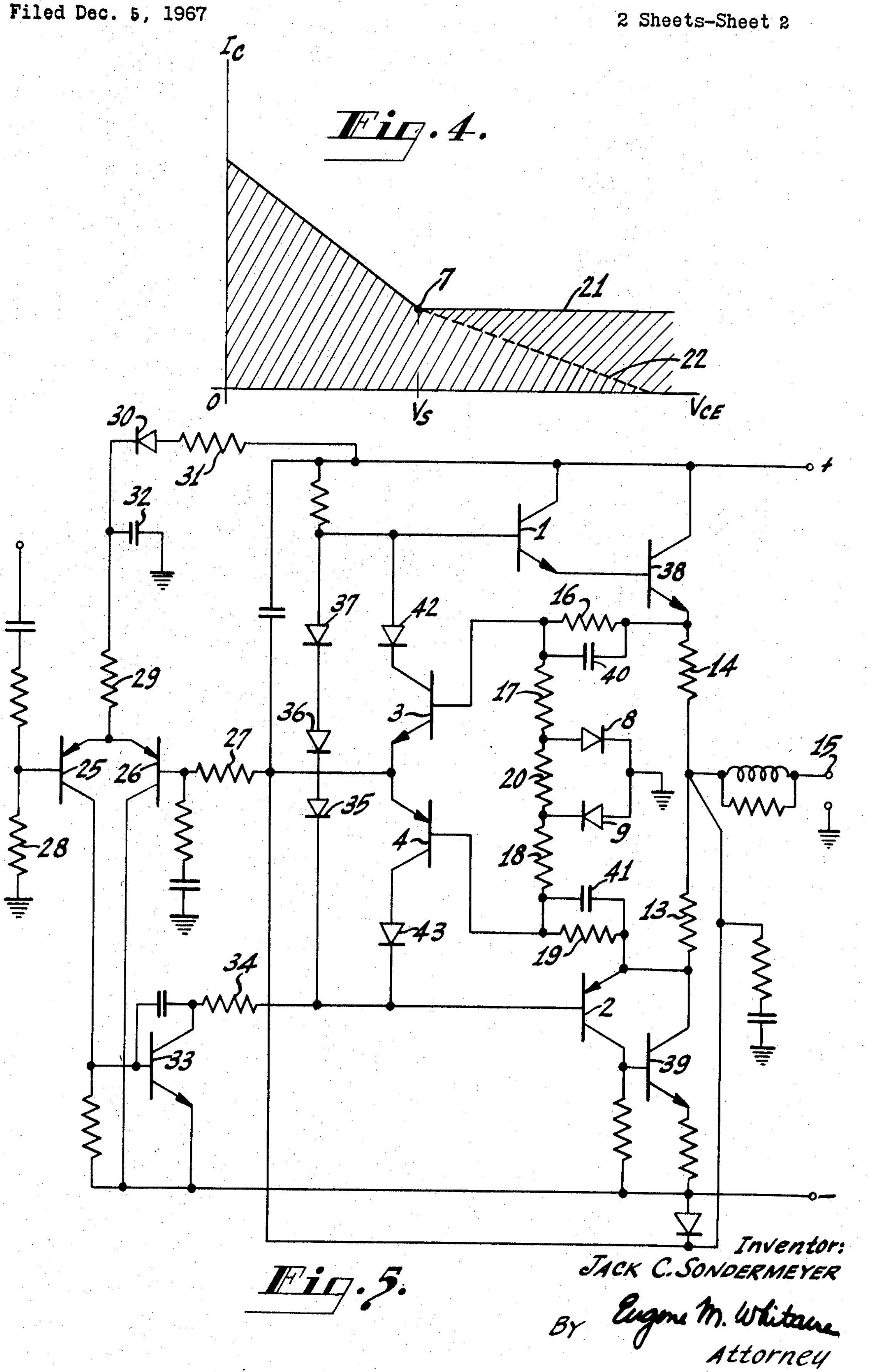
FIG. 4 is a graph of the safe area limiting provided by the embodiment in FIG. 3.
FIG. 5 is a schematic circuit diagram of a complete 70 watt audio amplifier embodying the invention.

Modification of the safe area limit contour is acnieved by the use of non-linear resistors or diodes as elements of the bridge network. FIG. 3 shows an output circuit where diodes 8 and 9 are added to the bridge networks to effect a safe area current limit alteration to a horizontal line 21 as is shown in FIG. 4. Also shown in FIG. 4 is the supply voltage $V_s$ corresponding to one positive power supply for transistor 1. For a voltage swing of the output terminal 15 to a negative value the bridge resistor 17 is decoupled by back bias of diode 8 and the protection transistor 3 will then only respond to output transistor current through resistor 14. Therefore, for collector voltages greater than the supply value, the circuit operates as only a current limiting system. The constant current slope can be altered by placing a resistor, not shown, in shunt with the diode 8 so that the diode does not completely decouple the resistor 17 branch of the bridge. An improved circuit employs a single resistor 20 to bypass both diodes 8 and 9 thereby preventing decoupling of resistors 17 and 18. An optional safe area limit slope provided by the diodes and the bypass resistor 20 is shown in FIG. 4 by the broken line 22. The break in slope of the safe area limit line at point 7 allows a reduced short circuit current limit, yet by the use of resistor 20 sufficient current at high collector voltages is permitted to dissipate stored transistor charge at high power and high frequencies.

A 70 watt audio power amplifier is shown in FIG. 5. The amplifier is a quasicomplementary symmetry type which provides the advantages of direct coupled wide band response, and feedback stabilization of the operating point.

As shown in FIG. 5 a preamplifier stage comprising transistors 25 and 26 form a differential amplifier circuit employed to set exact quiescent DC zero at the output terminal 15. Feedback is coupled by means of resistor 27 to the base electrode of transistor 26 and a ground reference is coupled through resistor 28 to the base electrode of transistor 25. The emitters of transistors 25 and 26 are returned in common to the positive supply by means of resistor 29, diode 30 and resistor 31. Diode 30 and an associated filter capacitor 32 decouple turn-off transients from the main supply. The collector output of preamplifier transistor 25 is coupled to a class A operated predriver stage transistor 33, the output of which is coupled to the complementary output transistors 1 and 2. Coupling from transistor 33 to transistors 1 and 2 is accomplished by means of a resistor 34 and a thermal biasing network comprising diodes 35, 36 and 37. Output transistors 1 and 2 are coupled to a pair of like type conductivity transistors 38 and 39 in a quasicomplementary output circuit. The safe area limiting circuits are coupled to the base input of the complementary driver transistors 1 and 2 to provide the safe area limiting of the output transistors 38 and 39. Current sampling is made across resistor 14 in series with the emitter of transistors 1 and 38 for positive audio cycles and across resistor 13 in series with the emitter of transistor 2 and the collector of transistor 39 for negative audio cycles. Capacitor 40 connected across bridge resistor 16 and capacitor 41 connected across bridge resistor 19 provide phase compensation to improve safe area limiting performance at high power and high frequencies. Diode 42 is connected in series with the collector of transistor 3 and diode 43 is connected in series with the collector of transistor 4 to prevent forward bias of the collector base junctions of transistors 3 and 4 during alternate polarities of the audio cycle.

What is claimed is:

1. A protection circuit for an electrical signal amplifier comprising in combination;

first and second opposite conductivity transistors having base, emitter and collector electrodes;

a signal input circuit coupled to the base electrodes of the pair of transistors providing common phase signal drive;

an output terminal, and a ground reference terminal;

means coupling the emitters of the first and second transistors to the output terminal providing common phase output;

a first current sampling means connected in series between the emitter of the first transistor and the output terminal;

a second current sampling means connected in series between the emitter of the second transistor and the output terminal;

third and fourth protection transistors of opposite conductivity types having base, emitter and collector electrodes;

the third protection transistor being of the same conductivity type as said first transistor and having its collector electrode connected to the base electrode of the first transistor and its emitter electrode connected to the output terminal;

the fourth protection transistor being of the same conductivity type as said second transistor and having its collector electrode connected to the base electrode of the second transistor and its emitter electrode connected to the output terminal;

a first resistor connected between the emitter of the first transistor and the base of the third transistor;

a second resistor connected between the emitter of the second transistor and the base of the fourth transistor;

a first diode connected to the ground reference terminal for a first polarity of conduction to ground;

and a second diode connected to the ground reference for a second and opposite polarity of conduction to ground;

a third resistor connected in series with the first diode and connected to the base electrode of the third transistor, the conductivity of the first transistor being such as to provide the first polarity of conduction to ground through the first resistor and the second resistor; and a fourth resistor connected in series with the second diode and connected to the base electrode of the fourth transistor;

and a fifth resistor direct current coupled across the first and second diodes.

References Cited

UNITED STATES PATENTS

| | | | |
|---|---|---|---|
| 2,832,900 | 4/1958 | Ford | 307—202 XR |
| 3,160,767 | 12/1964 | Tindall | 307—255 XR |
| 3,218,542 | 11/1965 | Taylor | 307—202 XR |
| 3,234,453 | 2/1966 | Klees et al. | 307—202 XR |
| 3,332,027 | 7/1967 | Suganuma. | |
| 3,372,344 | 3/1968 | Hafler. | |
| 3,408,589 | 10/1968 | Nishioka. | |
| 3,414,803 | 12/1968 | Glasgow et al. | 323—4 |

WILLIAM M. SHOOP, Jr., Primary Examiner

U.S. Cl. X.R.

307—202, 255; 330—13